(12) United States Patent
Kudo

(10) Patent No.: US 9,515,665 B1
(45) Date of Patent: Dec. 6, 2016

(54) SELECTOR CIRCUIT, EQUALIZER CIRCUIT, AND SEMICONDUCTOR INTEGRATED CIRCUIT

(71) Applicant: SOCIONEXT INC., Yokohama-shi, Kanagawa (JP)

(72) Inventor: Masahiro Kudo, Kawasaki (JP)

(73) Assignee: Socionext, Inc., Yokohama (JP)

( * ) Notice: Subject to any disclaimer, the term of this patent is extended or adjusted under 35 U.S.C. 154(b) by 0 days.

(21) Appl. No.: 15/090,136

(22) Filed: Apr. 4, 2016

(30) Foreign Application Priority Data

May 20, 2015 (JP) ................................. 2015-103191

(51) Int. Cl.
| | | |
|---|---|---|
| *H03K 5/159* | (2006.01) | |
| *H03L 7/08* | (2006.01) | |
| *H04L 25/03* | (2006.01) | |
| *H04L 7/00* | (2006.01) | |

(52) U.S. Cl.
CPC .......... *H03L 7/0807* (2013.01); *H04L 7/0016* (2013.01); *H04L 25/03019* (2013.01)

(58) Field of Classification Search
CPC . G11C 7/062; H03F 3/087; H03K 19/00361; H03K 17/6872; H03K 19/0016; H01L 27/0928
USPC .................. 375/232; 365/189.07; 369/124.1; 326/119, 121, 27, 34, 81, 83, 87, 95, 326/98; 327/328, 408
See application file for complete search history.

(56) References Cited

U.S. PATENT DOCUMENTS

| | | | | |
|---|---|---|---|---|
| 5,376,829 A | * | 12/1994 | Rogers | H03K 17/693 327/362 |
| 6,081,135 A | * | 6/2000 | Goodnow | H03K 19/0016 326/119 |
| 2005/0166107 A1 | | 7/2005 | Komaki | |
| 2006/0097788 A1 | * | 5/2006 | Yang | H03F 3/45251 330/258 |
| 2014/0269027 A1 | * | 9/2014 | Tayal | G11C 11/412 365/156 |
| 2015/0364178 A1 | * | 12/2015 | Kim | G11C 11/1673 365/66 |

FOREIGN PATENT DOCUMENTS

| | | |
|---|---|---|
| JP | 04-196618 A | 7/1992 |
| JP | 05-304455 A | 11/1993 |
| WO | WO 2004/049570 A1 | 6/2004 |

* cited by examiner

*Primary Examiner* — Leila Malek
(74) *Attorney, Agent, or Firm* — Arent Fox LLP

(57) ABSTRACT

A first P-channel transistor to a gate of which a first input signal is inputted and a second P-channel transistor to a gate of which a selection signal is inputted are provided in series between a power supply line and an output node. A first N-channel transistor to a gate of which a second input signal is inputted and a second N-channel transistor to a gate of which the selection signal is inputted are provided in series between a ground line and the output node. A third P-channel transistor to a gate of which the second input signal is inputted is provided between the gate of the second P-channel transistor and the output node, and a third N-channel transistor to a gate of which the first input signal is inputted is provided between the gate of the second N-channel transistor and the output node.

19 Claims, 9 Drawing Sheets

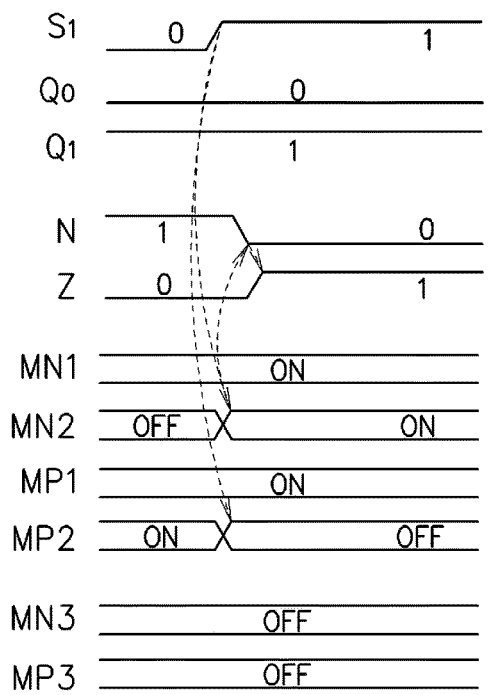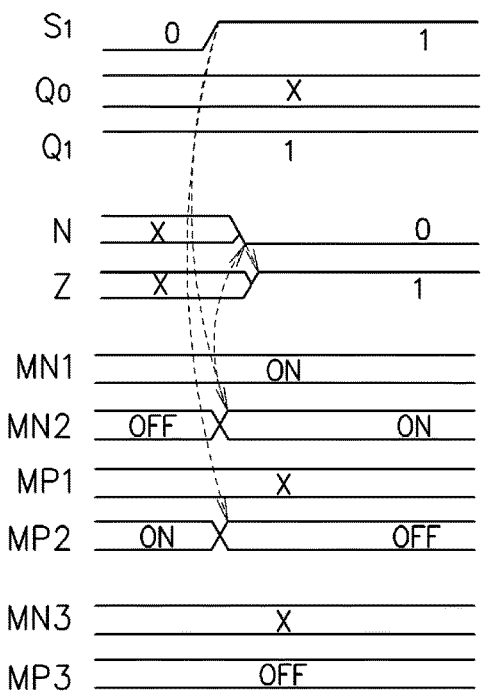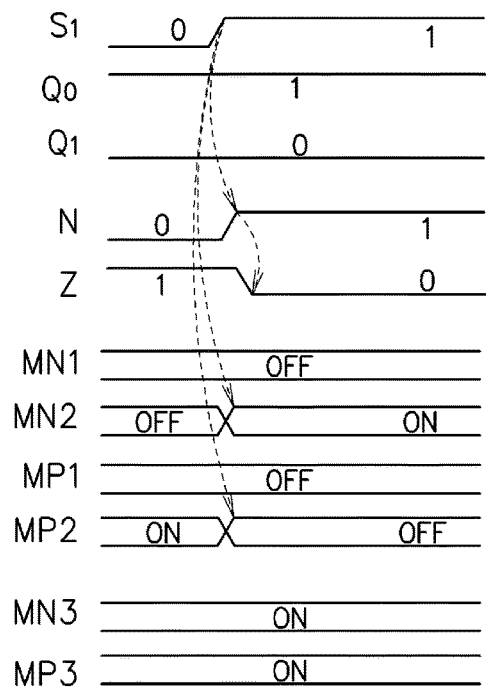

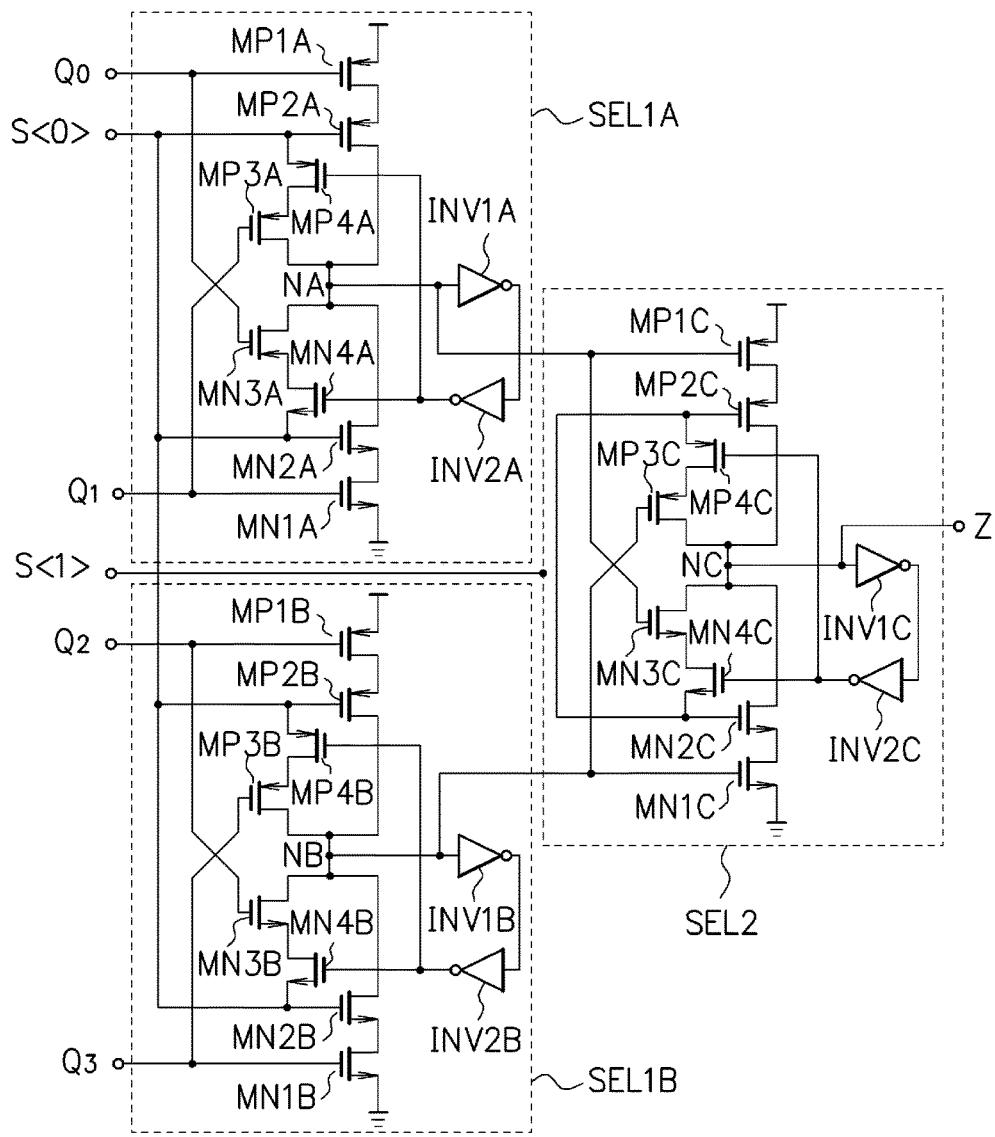

F I G. 11
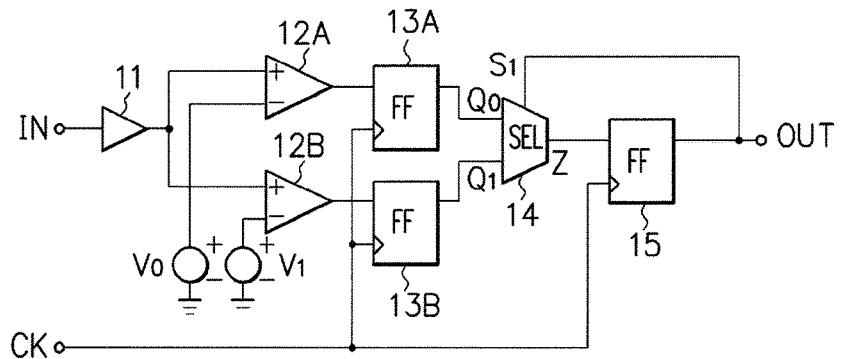
F I G. 12
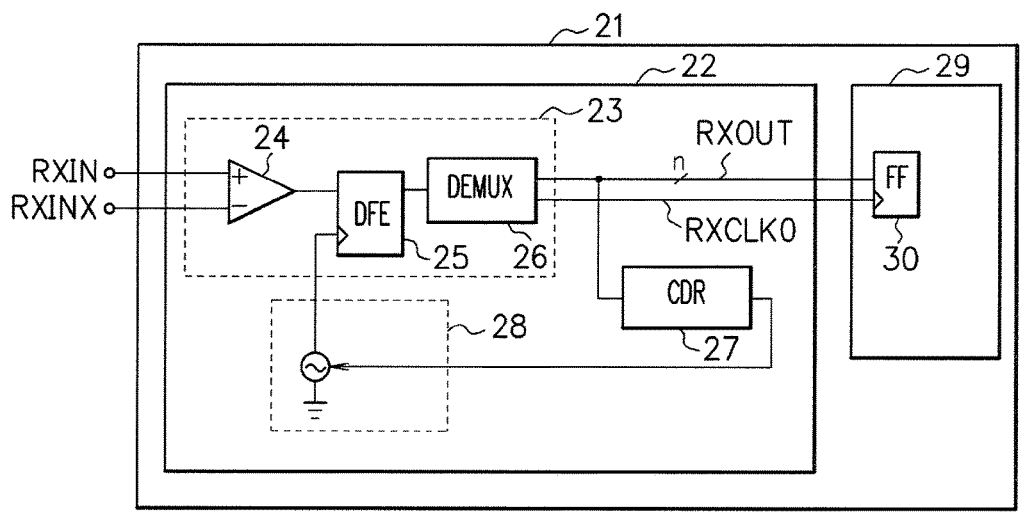
F I G. 13
Related Art
| INPUT | | | OUTPUT |
|---|---|---|---|
| $S_1$ | $Q_0$ | $Q_1$ | Z |
| 0 | 0 | X | 0 |
| 0 | 1 | X | 1 |
| 1 | X | 0 | 0 |
| 1 | X | 1 | 1 |

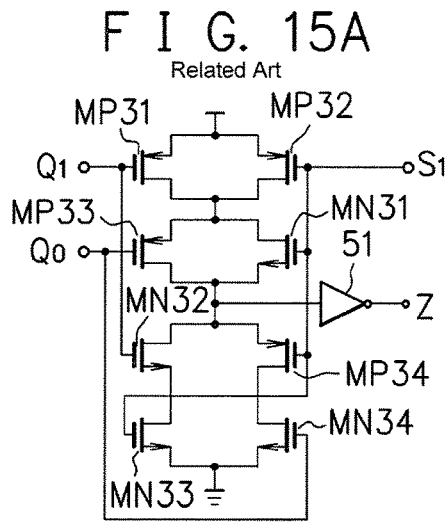
FIG. 15A
Related Art
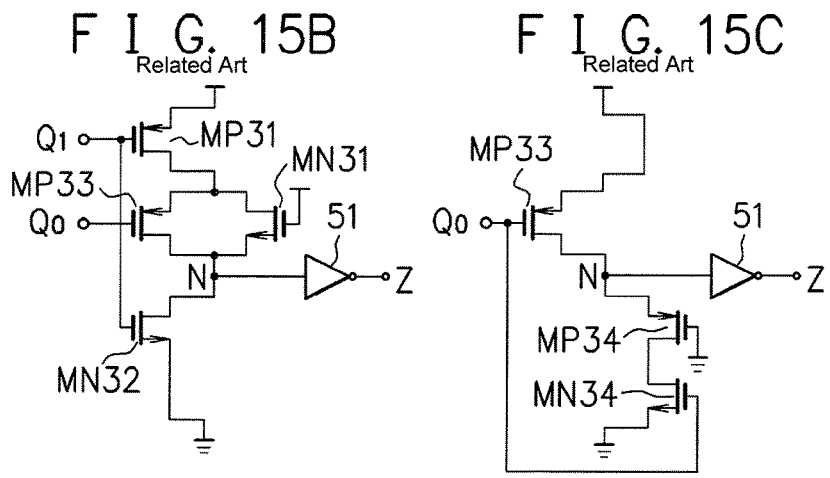
FIG. 15B
Related Art
FIG. 15C
Related Art
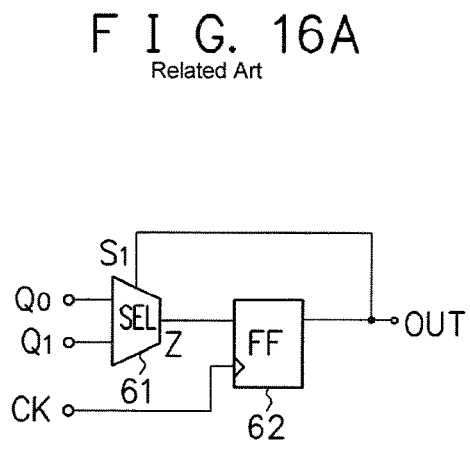
FIG. 16A
Related Art
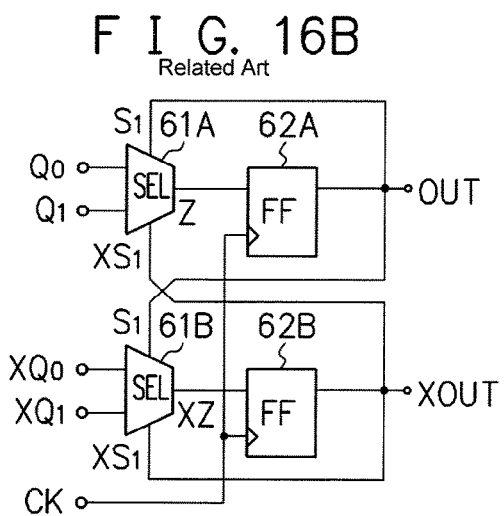
FIG. 16B
Related Art

SELECTOR CIRCUIT, EQUALIZER CIRCUIT, AND SEMICONDUCTOR INTEGRATED CIRCUIT

CROSS-REFERENCE TO RELATED APPLICATION

This application is based upon and claims the benefit of priority of the prior Japanese Patent Application No. 2015-103191, filed on May 20, 2015, the entire contents of which are incorporated herein by reference.

FIELD

The embodiments discussed herein are directed to a selector circuit, an equalizer circuit, and a semiconductor integrated circuit.

BACKGROUND

A selector circuit selectively outputs one input signal from among a plurality of input signals in correspondence with a selection signal. The selector circuit is one of basic elements of a CMOS logic circuit. For example, as illustrated in a truth table in FIG. 13, a two-input selector circuit, for two input signals $Q_0$, $Q_1$, outputs the input signal $Q_0$ as an output signal Z when a selection signal $S_1$ is "0" and outputs the input signal $Q_1$ as the output signal Z when the selection signal $S_1$ is "1".

As a selector circuit which realizes a function of the truth table illustrated in FIG. 13, there are ones illustrated in FIG. 14A to FIG. 14C, for example. FIG. 14A to FIG. 14C are diagrams illustrating configuration examples of a conventional two-input selector circuit.

In the selector circuit illustrated in FIG. 14A, an input signal $Q_1$ and a selection signal $S_1$ are inputted to a NAND (negative logical product) gate 41, and an input signal $Q_0$ and the selection signal $S_1$ inverted by an inverter 44 are inputted to a NAND gate 42. Outputs of the NAND gates 41, 42 are inputted to a NAND gate 43. An output of the NAND gate 43 is outputted as an output signal Z. The selector circuit illustrated in FIG. 14A outputs a value of the input signal $Q_0$ as the output signal Z via the NAND gates 42, 43 when the selector signal $S_1$ is "0", and outputs a value of the input signal $Q_1$ as the output signal Z via the NAND gates 41, 43 when the selection signal $S_1$ is "1".

In the selector circuit illustrated in FIG. 14B, an input signal $Q_1$ is inputted to a transfer gate 48 composed of a P-channel MOS transistor MP21 and an N-channel MOS transistor MN21, and an input signal $Q_0$ is inputted to a transfer gate 49 composed of a P-channel MOS transistor MP22 and an N-channel MOS transistor MN22. The two transfer gates 48, 49 are controlled to come to be in ON states (continuity states) exclusively, by a selection signal $S_1$ and the selection signal $S_1$ inverted by the inverter 45. In the selector circuit illustrated in FIG. 14B, the transfer gate 49 comes to be in an ON state when the selection signal $S_1$ is "0", a value of the input signal $Q_0$ being outputted as an output signal Z, and the transfer gate 48 comes to be in an ON state when the selection signal $S_1$ is "1", a value of the input signal $Q_1$ being outputted as the output signal Z.

The selector circuit illustrated in FIG. 14C is a selector circuit by a dynamic logic circuit. In the selector circuit illustrated in FIG. 14C, a precharge period and an evaluation period are repeated alternately and a selector function is realized in the evaluation period. An input node of an inverter 47 which outputs an output signal Z is connected to a power supply line via a 2-channel MOS transistor MP23 to a gate of which a precharge signal $\phi_{pc}$ is inputted. The input node of the inverter 47 is connected to a ground line via N-channel MOS transistors MN23, MN24 to gates of which an input signal $Q_1$ and a selection signal $S_1$ are inputted respectively, and connected to a ground line via N-channel MOS transistors MN25, MN26 to gates of which an input signal $Q_0$ and the selection signal $S_1$ inverted by an inverter 46 are inputted respectively.

In the selector circuit illustrated in FIG. 14C, in the precharge period (at this time, both the input signals $Q_0$, $Q_1$ are "0") during which the precharge signal $\phi_{pc}$ is "0", the input node of the inverter 47 is reset to be "1" and the output signal Z is reset to be "0". In the evaluation period during which the precharge signal $\phi_{pc}$ is "1", the input node of the precharged inverter 47 transits to "0" and the output signal Z transits to "1" when the selection signal $S_1$ and the input signal $Q_1$ are "1" simultaneously or when the inversion signal of the selection signal $S_1$ and the input signal $Q_0$ are "1" simultaneously, whereby the selector function is realized.

In the two-input selector circuits illustrated in FIG. 14A to FIG. 14C, the selector function is each realized by the inversion signal of the selection signal $S_1$ obtained by inverting the selection signal $S_1$ by the inverters 44, 45, 46. In contrast, as illustrated in FIG. 15A, there is suggested a two-input selector circuit which realizes a selector function by connecting P-channel MOS transistors MP31 to MP34, N-channel MOS transistors MN31 to MN34, and an inverter 51, without using an inversion signal of a selection signal $S_1$ (see Patent Document 1).

When the selection signal $S_1$ is "1", the P-channel MOS transistors MP32, MP34 come to be in OFF states and the N-channel MOS transistor MN33 comes to be in an ON state, and thus a signal path of the selector circuit illustrated in FIG. 15A becomes as illustrated in FIG. 15B. When it is assumed that the N-channel MOS transistor MN31 is almost in an ON state, a circuit illustrated in FIG. 15B performs an operation of an inverter whose input is an input signal $Q_1$, so that an output signal Z is the same value as that of the input signal $Q_1$, which means that the input signal $Q_1$ is selected.

When the selection signal $S_1$ is "0", the P-channel MOS transistor MP32 comes to be in an ON state and the N-channel MOS transistor MN33 comes to be in an OFF state, and thus the signal path of the selector circuit illustrated in FIG. 15A becomes as illustrated in FIG. 15C. When it is assumed that the P-channel MOS transistor MP34 is almost in an ON state, a circuit illustrated in FIG. 15C performs an operation of an inverter whose input is an input signal $Q_0$, so that the output signal Z is the same value as that of the input signal $Q_0$, which means that the input signal $Q_0$ is selected. As described above, the selector circuit illustrated in FIG. 15A operates as a selector circuit which outputs the value of the input signal $Q_1$ as the output signal Z when the selection signal $S_1$ is "1", and which outputs the value of the input signal $Q_0$ as the output signal Z when the selection signal $S_1$ is "0".

[Patent Document 1] Japanese Laid-open Patent Publication No. 04-196618

As one of circuits in which a selector circuit is used, there is a decision feedback equalizer (DFE) used for a receiver of a serializer/de-serializer (SerDes). FIG. 16A is a diagram illustrating an application example of the selector circuit in the decision feedback equalizer. A selector circuit 61 selects, in correspondence with a selection signal $S_1$, an input signal from input signals $Q_0$, $Q_1$ being decision results at reference voltages corresponding to cases where previous data is "0" and "1" respectively and outputs as an output signal Z. A flip-flop 62 latches the output signal Z of the selector circuit 61 in synchronization with a clock signal CK, and outputs the latched signal as an output signal OUT and outputs the latched signal to the selector circuit 61 as the selection signal $S_1$ related to the next data.

In a decision feedback equalizer such as illustrated in FIG. 16A, an output signal of a selector circuit is feedbacked as a selection signal of the selector circuit. In a case where the decision feedback equalizer deals with a high-speed signal whose data rate or clock is of high speed, generation of the selection signal (a loop part in which the selection signal $S_1$ is generated through the flip-flop 62 in the example of the drawing) sometimes becomes a bottleneck of a circuit operation. In this case, if an inversion signal of the selection signal is generated from the selection signal by using an inverter as in the selector circuits illustrated in FIG. 14A to FIG. 14C, there is a problem that an operating frequency of the decision feedback equalizer becomes low due to delay of the above. For example, as illustrated in FIG. 16B, as a result that an entire circuit is constituted with a differential circuit by using two selectors 61A, 61B and two flip-flops 62A, 62B, it becomes possible to generate an inversion signal of a selection signal without delay. However, if the entire circuit is constituted with the differential circuit, a circuit scale becomes twofold, and a power consumption and a circuit area also become twofold.

Though the selector circuit illustrated in FIG. 15A realizes the selector function without using the inversion signal of the selection signal $S_1$, there is a case where a high-speed operation is not performed as described below. For example, in a case where the input signal $Q_1$ is "0" and the input signal $Q_0$ is "1" when the selection signal $S_1$ is "1", a potential of an input node N of the inverter 51 rises quickly to a potential lowered from a power supply voltage by a threshold voltage of the N-channel MOS transistor MN31. However, in order for rising to a power supply voltage level thereafter, it is necessary to wait for a leak of the N-channel MOS transistor MN31, so that a high-speed operation is not performed in a recent circuit which operates at a low voltage. Similarly, in a case where the input signal $Q_0$ is "1" when the selection signal $S_1$ is "0", for example, the potential of the input node N of the inverter 51 lowers quickly to a potential raised from a ground voltage by a threshold voltage of the P-channel MOS transistor MP34. However, for lowering to a ground level thereafter, it is necessary to wait for a leak from the P-channel MOS transistor MP34, so that a high-speed operation is not be performed in a circuit operated at a low voltage.

SUMMARY

In one aspect of a selector circuit, a first P-channel transistor to a gate of which a first input signal is inputted and a second P-channel transistor to a gate of which a selection signal is inputted are provided in series between a power supply line and an output node. And a first N-channel transistor to a gate of which a second input signal is inputted and a second N-channel transistor to a gate of which the selection signal is inputted are provided in series between a ground line and the output node. A third P-channel transistor to a gate of which the second input signal is inputted is provided between the gate of the second P-channel transistor and the output node. A third N-channel transistor to a gate of which the first input signal is inputted is provided between the gate of the second N-channel transistor and the output node.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8A and FIG. 8B are timing charts each illustrating an operation example of the selector circuit illustrated in FIG. 6;

FIG. 9 is a timing chart illustrating an operation example of the selector circuit illustrated in FIG. 6;

FIG. 10A is a diagram illustrating another configuration example of the selector circuit in the present embodiment;

FIG. 10B is a diagram illustrating a truth table of the selector circuit illustrated in FIG. 10A;

FIG. 11 is a diagram illustrating a configuration example of a decision feedback equalizer in the present embodiment;

FIG. 12 is a diagram illustrating a configuration example of a semiconductor integrated circuit in the present embodiment;

FIG. 13 is a diagram illustrating a truth table of a two-input selector circuit;

FIG. 15A to FIG. 15C are diagrams illustrating another configuration example of the conventional two-input selector circuit; and FIG. 16A and FIG. 16B are diagrams each illustrating an application example of a selector circuit in a decision feedback equalizer.

DESCRIPTION OF EMBODIMENTS

Hereinafter, embodiments will be described based on the drawings. It is assumed hereinafter that each signal is of positive logic, and explanation is carried out on the assumption that "1" means being at a high level (first logic level) and that "0" means being at a low level (second logic level).

Figure 1:
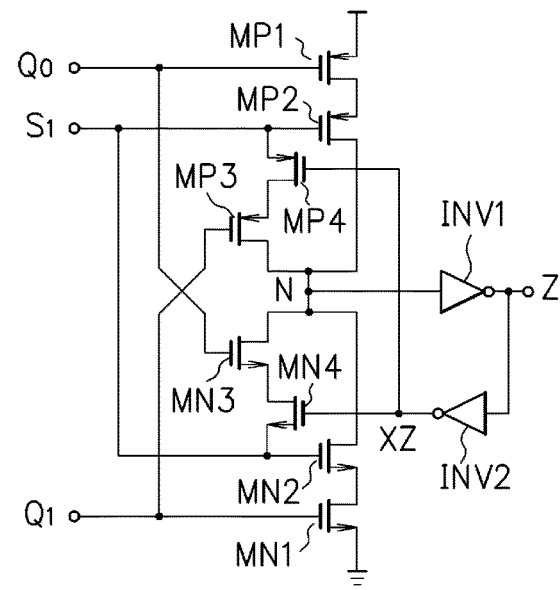
FIG. 1 is a diagram illustrating a configuration example of a selector circuit in a present embodiment.

FIG. 1 is a diagram illustrating a configuration example of a selector circuit in a present embodiment. The selector circuit illustrated in FIG. 1 includes P-channel MOS transistors MP1 to MP4, N-channel MOS transistors MN1 to MN4, and inverters INV1, INV2.

The first P-channel MOS transistor MP1 to a gate of which a first input signal $Q_0$ is inputted and the second P-channel MOS transistor MP2 to a gate of which a selection signal $S_1$ is inputted are connected in series between a power supply line which supplies a power supply voltage and an output node N. The first N-channel MOS transistor MN1 to a gate of which a second input signal $Q_1$ is inputted and the second N-channel MOS transistor MN2 to a gate of which the selection signal $S_1$ is inputted are connected in series between a ground line which supplies a reference voltage (ground voltage) and the output node N.

The third P-channel MOS transistor MP3 to a gate of which the second input signal $Q_1$ is inputted and the fourth P-channel MOS transistor MP4 to a gate of which a signal XZ with the same value as that of the output node N is inputted are connected in series between the output node N and the gate of the second P-channel MOS transistor MP2. The third N-channel MOS transistor MN3 to a gate of which the first input signal $Q_0$ is inputted and the fourth N-channel MOS transistor MN4 to a gate of which the single XZ with the same value as that of the output node N is inputted are connected in series between the output node N and the gate of the second N-channel MOS transistor MN2.

The inverter INV1 logically inverts a signal of the output node N and outputs as an output signal Z. The inverter INV2 logically inverts the output signal Z and outputs as an inversion signal XZ of the output signal Z.

In other words, in the first P-channel MOS transistor MP1, a source is connected to the power supply line, to the gate is inputted the first input signal $Q_0$, and a drain is connected to a source of the second P-channel MOS transistor MP2. In the second P-channel MOS transistor MP2, to the gate is inputted the selection signal $S_1$, and a drain is connected to the output node N. In the fourth P-channel MOS transistor MP4, a source is connected to the gate of the second P-channel MOS transistor MP2, to the gate is inputted the inversion signal XZ of the output signal Z, and a drain is connected to a source of the third P-channel MOS transistor MP3. In the third P-channel MOS transistor MP3, to the gate is inputted the second input signal $Q_1$ and a drain is connected to the output node N.

In the first N-channel MOS transistor MN1, a source is connected to the ground line, to the gate is inputted the second input signal $Q_1$, and a drain is connected to a source of the second N-channel MOS transistor MN2. In the second N-channel MOS transistor MN2, to the gate is inputted the selection signal $S_1$, and a drain is connected to the output node N. In the fourth N-channel MOS transistor MN4, a source is connected to the gate of the second N-channel MOS transistor MN2, to the gate is inputted the inversion signal XZ of the output signal Z, and a drain is connected to a source of the third N-channel MOS transistor MN3. In the third N-channel MOS transistor MN3, to the gate is inputted the first input signal $Q_0$, and a drain is connected to the output node N.

Next, an operation of the selector circuit illustrated in FIG. 1 will be described. When the selection signal $S_1$ is "1", the P-channel MOS transistor MP2 comes to be in an OFF state, and the N-channel MOS transistor MN2 comes to be in an ON state, so that a signal path of the selector circuit illustrated in FIG. 1 becomes as illustrated in FTG. 2A. The N-channel MOS transistor MN3 to which the input signal $Q_0$ is inputted exists in a path that connects the power supply voltage (selection signal $S_1$, in practice) and the output node N, and the N-channel MOS transistor MN4 to which the inversion signal XZ is inputted is inserted in series into this path.

When the input signal $Q_1$ is "1", the P-channel transistor MP3 comes to be in an OFF state and the N-channel MOS transistor MN1 comes to be in an ON state. In a case where the N-channel MOS transistor MN1 is in the ON state, even if the N-channel MOS transistors MN3, MN4 are in ON states, the N-channel MOS transistors MN3, MN4 operate in a saturation region (operating similarly to a current source), whereby a potential of the output node N comes to be a potential almost equal to a ground level. As a result that the potential of the output node N becomes the potential almost equal to the ground level, the output signal Z comes to be "1" and the inversion signal XZ comes to be "0". The N-channel MOS transistor MN4 comes to be in an OFF state finally and a current in this path is interrupted, so that the output node N is also settled to be "0" finally. Thereby, the output signal Z is determined to be "1".

Figure 3A:
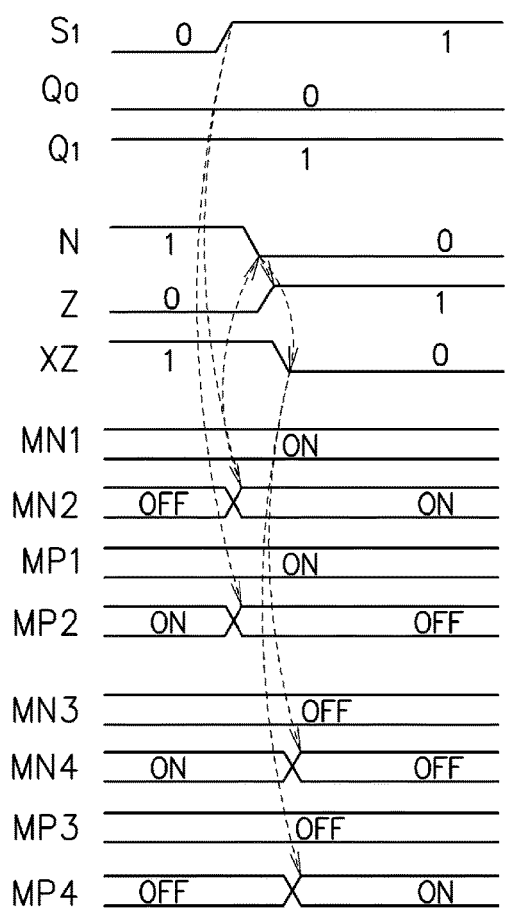
FIG. 3A and FIG. 3B are timing charts each illustrating an operation example of the selector circuit illustrated in FIG. 1.

For example, as illustrated in FIG. 3A, when the selection signal $S_1$ changes from "0" to "1" in a state where the input signal $Q_0$ is "0" and the input signal $Q_1$ is "1", the N-channel MOS transistor MN2 comes to be in the ON state and the P-channel MOS transistor MP2 comes to be in the OFF state. As a result that the N-channel MOS transistor MN2 comes to be in the ON state, the output node N comes to be "0" via the N-channel MOS transistors MN1, MN2, so that the output signal Z comes to be "1". As a result that the output signal Z comes to be "1", the inversion signal XZ comes to be "0", the N-channel MOS transistor MN4 comes to be in the OFF state, and the P-channel MOS transistor MP4 comes to be in an ON state, but no influence is given since both the N-channel MOS transistor MN3 and the P-channel MOS transistor MP3 are in the OFF states due to the input signals $Q_0$ and $Q_1$.

Figure 3B:
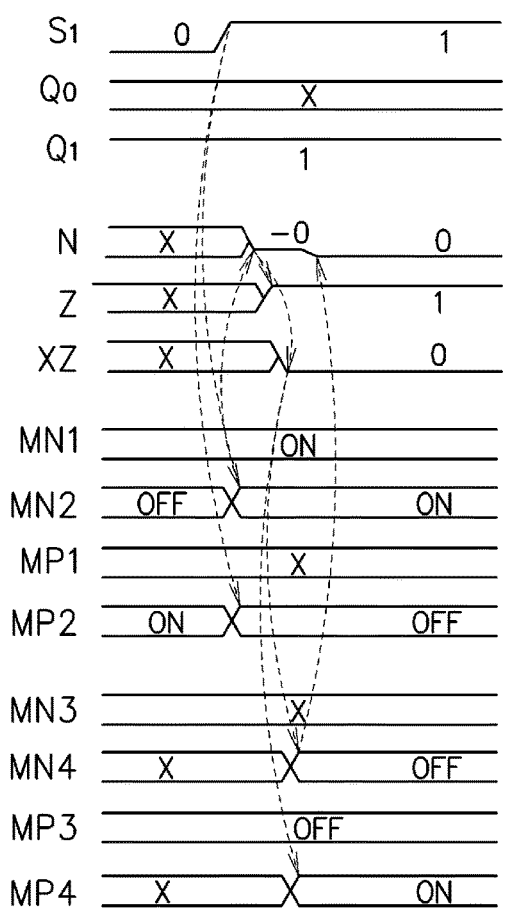

If it is assumed that the input signal $Q_0$ is "X" (indefinite), as illustrated in FIG. 3B, while the output node N is pulled down to "0" via the N-channel MOS transistors MN1, MN2, there can exist a path connected to the output node N via the N-channel MOS transistors MN3, MN4. In such a case, as a result that the N-channel MOS transistors MN3, MN4 operate similarly to a cascode current source of the N-channel MOS transistor as described above, on-resistances exhibited by the N-channel MOS transistors MN1, MN2 are substantially smaller in relation to resistances exhibited by the N-channel MOS transistors MN3, MN4, so that the output node N comes to be almost "0" level. Thereafter, the N-channel MOS transistor MN4 comes to be in the OFF state and the path constituted with the N-channel MOS transistors MN3, MN4 are interrupted, so that the output, node N comes to be "0".

When the input signal $Q_1$ is "0", the P-channel MOS transistor MP3 comes to be in an ON state and the N-channel MOS transistor MN1 comes to be in an OFF state. As a result that the N-channel MOS transistor MN1 comes to be in the OFF state, a path from the output node N to the ground line is disconnected. In a case where the output node N is "0", the inversion signal XZ is also "0", and thus the P-channel MOS transistor MP4 is in the ON state, so that a path connecting a power supply and the output node N, the path being constituted with the P-channel MOS transistors MP3, MP4, is conducted. Thereby, the output node N transits to "1", and the output signal Z is determined to be "0" in response thereto. In a case where the output node N is "1", the output signal Z has originally been determined to be "0", so that transition does not occur. As a result that the output signal Z is determined to be "0", the inversion signal XZ comes to be "1", and the P-channel MOS transistor MP4 comes to be in an OFF state and the N-channel MOS transistor MN4 comes to be in the ON state. A path into which the N-channel MOS transistor MN4 is inserted is the path connecting the power supply voltage (selection signal $S_1$, in practice) and the output node N as described above, the output node N being "1" regardless of whether that path is in an ON state or in an OFF state, so that transition of the state does not occur and no influence is given.

Figure 4:
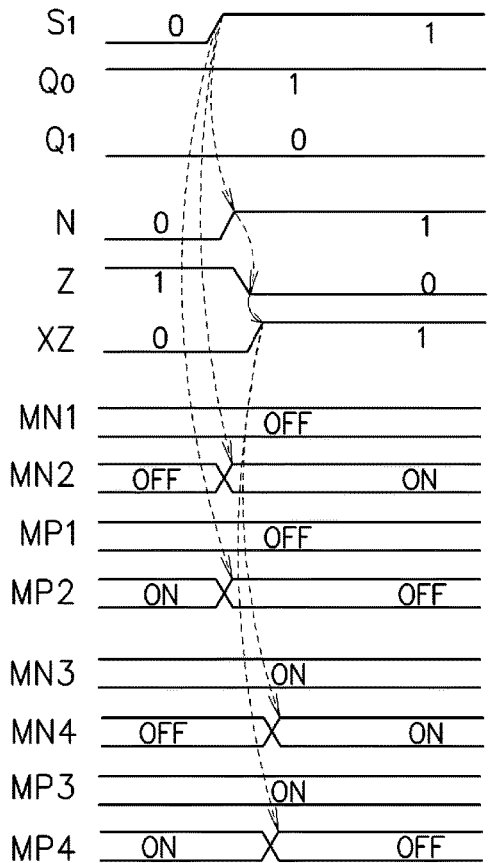
FIG. 4 is a timing chart illustrating an operation example of the selector circuit illustrated in FIG. 1.

For example, as illustrated in FIG. 4, when the selection signal $S_1$ changes from "0" to "1" in a state where the input signal $Q_0$ is "1" and the input signal $Q_1$ is "0", the N-channel MOS transistor MN2 comes to be in the ON state and the P-channel MOS transistor MP2 comes to be in the OFF state. Then, the output node N comes to be "1" via the P-channel MOS transistors MP3, MP4, and the output signal Z comes to be "0". As a result that the output signal Z comes to be "0", the inversion signal XZ comes to be "1", the N-channel MOS transistor MN4 comes to be in the ON state, and the P-channel MOS transistor MP4 comes to be in the OFF state, but the signal of the output node N does not change since the output node N is connected to the power supply voltage (selection signal $S_1$, in practice) via the N-channel MOS transistors MN3, MN4.

Figure 2A:
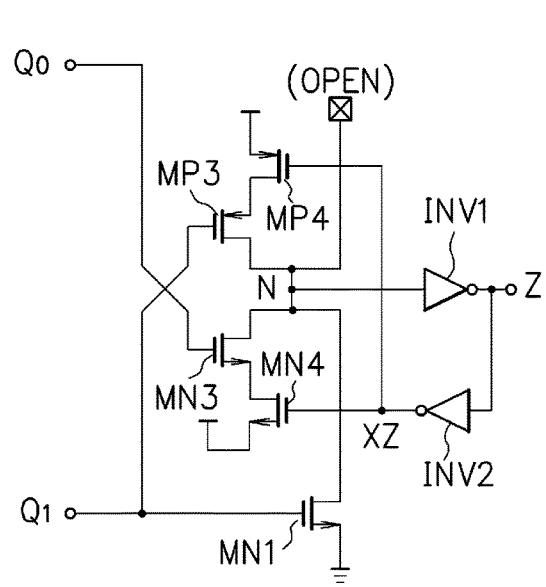
FIG. 2A and FIG. 2B are schematic diagrams each illustrating a signal path corresponding to a state of a selection signal in the selector circuit illustrated in FIG. 1.
Figure 2B:
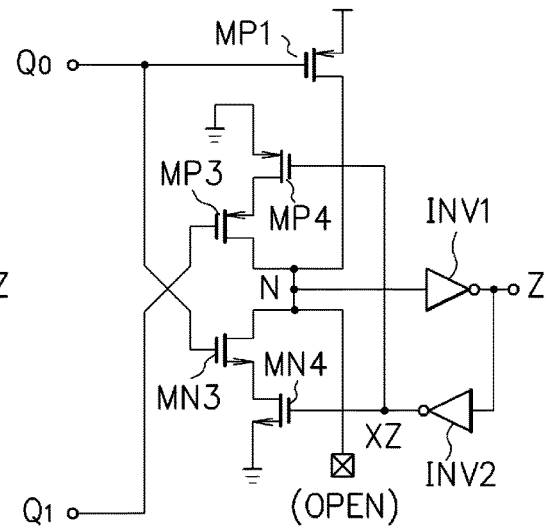

When the selection signal $S_1$ is "0", the P-channel MOS transistor MP2 comes to be in an ON state, and the N-channel MOS transistor MN2 comes to be in an OFF state, so that a signal path of the selector circuit illustrate in FIG. 1 becomes as illustrated in FIG. 2B. The P-channel MOS transistor MP3 to which the input signal $Q_1$ is inputted exists in the path that connects the ground voltage (selection signal $S_1$, in practice) and the output node N, and the P-channel. MOS transistor MP4 to which the inversion signal XZ is inputted is inserted in series into that path.

When the input signal $Q_0$ is "0", the N-channel MOS transistor MN3 comes to be in the OFF state and the P-channel MOS transistor MP1 comes to be in an ON state. In a case where the P-channel MOS transistor MP1 is in the ON state, even if the P-channel MOS transistors MP3, MP4 are in the ON states, the P-channel MOS transistors MP3, MP4 operate in a saturation region (operates similarly to a current source), whereby the potential of the output node N comes to be a potential almost equal to a power supply voltage level. As a result that the potential of the output node N comes to be almost equal to the power supply voltage level, the output signal Z comes to be "0" and the inversion signal XZ comes to be "1". The P-channel MOS transistor MP4 comes to be in the OFF state finally and the current in this path is interrupted so that the output node N is also settled to be "1" finally. Thereby, the output signal Z is determined to be "0".

When the input signal $Q_0$ is "1", the N-channel MOS transistor MN3 comes to be in the ON state and the P-channel MOS transistor MP1 comes to be in an OFF state. As a result that the P-channel MOS transistor MP1 comes to be in the OFF state, the path from the output node N to the power supply line is disconnected. In a case where the output node N is "1", the inversion signal XZ is also "1", and thus the N-channel MOS transistor MN4 is in the ON state, so that the path connecting the ground voltage and the output node N, the path being constituted with the N-channel MOS transistors MN3, MN4, is conducted. Thereby, the output node N transits to "0" and the output signal Z is determined to be "1" in response thereto. In a case where the output node N is "0", the output signal Z has originally been determined to be "1", so that transition does not occur. As a result that the output signal Z is determined to be "1", the inversion signal XZ comes to be "0", and the N-channel MOS transistor MN4 comes to be in the OFF state and the P-channel MOS transistor MP4 comes to be in the ON state. The path into which the P-channel MOS transistor MP4 is inserted is the path connecting the ground voltage (selection signal $S_1$, in practice) and the output node N as described above, the output node N being "0" regardless of whether that path is in an ON state or in an OFF state, so that transition of the state does not occur and no influence is given.

As described above, in a case where the selection signal $S_1$ is "1", the selector circuit illustrated in FIG. 1 outputs the output signal Z of "1" when the input signal $Q_1$ is "1 and outputs the output signal Z of "0" when the input signal $Q_1$ is "0", regardless of the state of the input signal $Q_0$. In a case where the selection signal $S_1$ is "0", the selector circuit outputs the output signal Z of "1" when the input signal $Q_0$ is "1" and outputs the output signal Z of "0" when the input signal $Q_0$ is "0", regardless of the state of the input signal $Q_1$. Therefore, the selector circuit illustrated in FIG. 1 can perform a selector function without using an inversion signal of the selection signal $S_1$, so that a selector circuit which operates at a high speed can be realized. For example, since the selector circuit in the present embodiment can realize the selector function without using the inversion signal of the selection signal $S_1$, it is possible to realize an operation at a higher speed in a decision feedback equalizer (DFE) or the like in which generation of a selection signal becomes a bottleneck of an operation speed of a circuit.

The reason why the selector function can be realized without using the inversion signal of the selection signal $S_1$ is a circuit configuration which utilizes a fact that a behavior of an ON state and an OFF state in a case where a signal is given to a gate terminal is inverted in a P-channel MOS transistor and an N-channel MOS transistor. A path in which an input signal $Q_0$ mainly works is constituted with P-channel MOS transistors and a path in which an input signal $Q_1$ mainly works is constituted with N-channel MOS transistors, whereby exclusive selection is realized by the same selection signal $S_1$. With these paths only, there is a case where an output node N comes to be open depending on a combination of states of the selection signal $S_1$ and the input signals $Q_0$, $Q_1$, and thus, a path connecting the selection signal $S_1$ and the output node N is created and further a shoot-through current path is interrupted by using the signal XZ obtained by inverting the output signal Z so as that a steady shoot-through current does not flow. Since interruption of the shoot-through current is independent of a signal processing and is not required to be performed at a high speed, usage of a signal obtained by inverting an output does not cause a problem in operation.

Figure 5:
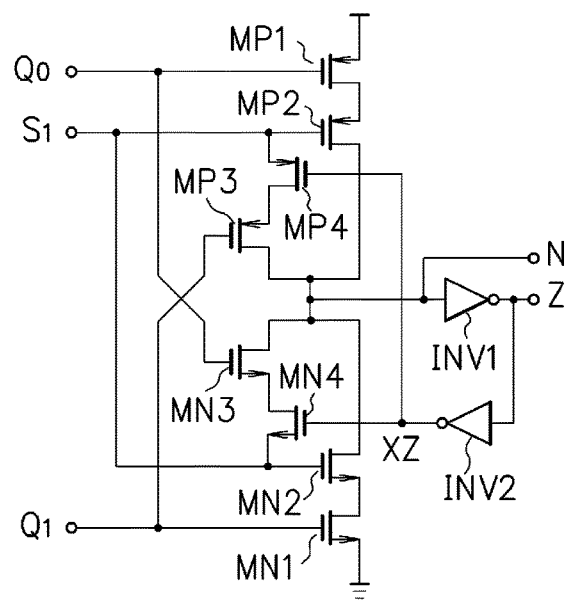
FIG. 5 is a diagram illustrating another configuration example of the selector circuit in the present embodiment.

Note that since the output node N is of inversion logic of the output signal Z, the output node N can be used as an inversion output of the selector circuit as illustrated in FIG. 5. The output node N is determined faster than the output signal Z by one stage of an inverter, and in a case where a configuration using an inversion output of a selector circuit in a circuit using the selector circuit is adopted, it becomes possible to operate at a faster speed.

In the selector circuit illustrated in FIG. 1, the P-channel MOS transistor MP4 and the N-channel MOS transistor MN4 to gates of which the inversion signal XZ of the output signal Z is inputted are provided, and the shoot-through current path is interrupted by using the inversion signal XZ so that the stable shoot-through current may not flow. However, in a case where a shoot-through current may flow, it is possible that the P-channel MOS transistor MP4 and the N-channel MOS transistor MN4 to the gates of which the inversion signal XZ is inputted are omitted (source/drain short circuit) as illustrated in FIG. 6.

Figure 6:
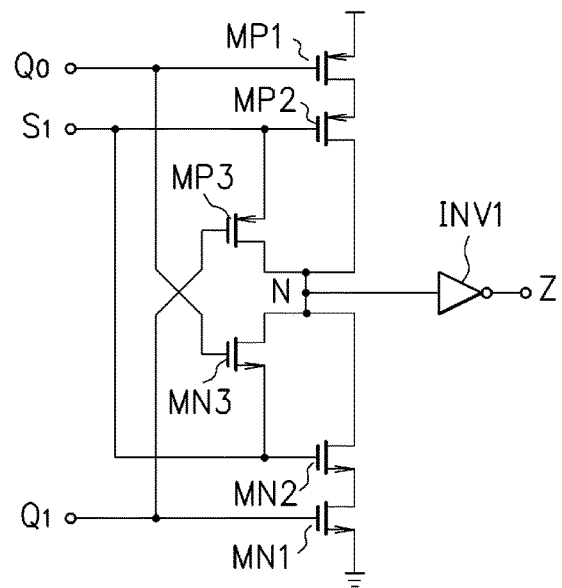
FIG. 6 is a diagram illustrating another configuration example of the selector circuit in the present embodiment.

FIG. 6 is a diagram illustrating another configuration example of the selector circuit in the present embodiment. In FIG. 6, the same reference symbol is given to a component the same as a component illustrated in FIG. 1. The selector circuit illustrated in FIG. 6 includes P-channel MOS transistors MP1 to MP3, N-channel MOS transistors MN1 to MN3, and an inverter INV1.

The first P-channel MOS transistor MP1 to a gate of which a first input signal $Q_0$ is inputted and the second P-channel MOS transistor MP2 to a gate of which a selection signal $S_1$ is inputted are connected in series between a power supply line and an output node N. The first N-channel MOS transistor MN1 to a gate of which a second input signal $Q_1$ is inputted and the second N-channel MOS transistor MN2 to a gate of which the selection signal $S_1$ is inputted are connected in series between a ground line and the output node N.

The third P-channel MOS transistor MP3 to a gate of which the second input signal $Q_1$ is inputted is connected between the output node N and the gate of the second P-channel MOS transistor MP2. The third N-channel MOS transistor MN3 to a gate of which the first input signal $Q_0$ is inputted is connected between the output node N and the gate of the second N-channel MOS transistor MN2. The inverter INV1 logically inverts a signal of the output node N and outputs as an output signal Z.

Figure 7A:
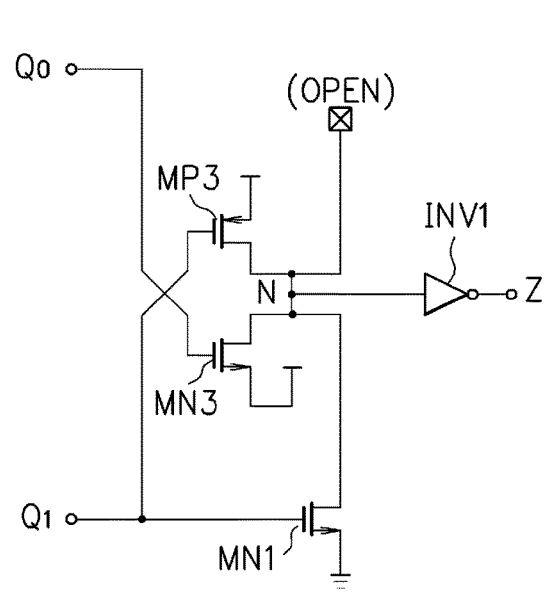
FIG. 7A and FIG. 7B are schematic diagrams each illustrating a signal path corresponding to a state of a selection signal in the selector circuit illustrated in FIG. 6.

An operation of the selector circuit illustrated in FIG. 6 will be described. When the selection signal $S_1$ is "1", the P-channel MOS transistor MP2 comes to be in an OFF state and the N-channel MOS transistor MN2 comes to be in an ON state, so that a signal path of the selector circuit illustrated in FIG. 6 becomes as illustrated in FIG. 7A.

When the input signal $Q_1$ is "1", the P-channel MOS transistor MP3 comes to be in an OFF state and the N-channel MOS transistor MN1 comes to be in an ON state. In a case where the N-channel MOS transistor MN1 is in the ON state, even if the N-channel MOS transistor MN3 is in ON states, the N-channel MOS transistor MN3 operates in a saturation region (operates similarly to a current source), whereby a potential of the output node N comes to be a potential almost equal to a ground level. As a result that the potential of the output node N becomes the potential almost equal to the ground level, the output signal Z becomes "1".

For example, as illustrated in FIG. 8A, when the selection signal $S_1$ changes from "0" to "1" in a state where the input signal $Q_0$ is "0" and the input signal $Q_1$ is "1", the N-channel MOS transistor MN2 comes to be in the ON state and the P-channel MOS transistor MP2 comes to be in the OFF state. As a result that the N-channel MOS transistor MN2 comes to be in the ON state, the output node N comes to be "0" via the N-channel MOS transistors MN1, MN2, so that the output signal Z comes to be "1".

If it is assumed that the input signal $Q_0$ is "X" (indefinite), as illustrated in FIG. 8B, while the output node N is pulled down to "0" via the N-channel MOS transistors MN1, MN2, there can exist a path connected to the output node N via the N-channel MOS transistor MN3. In such a case, as a result that the N-channel MOS transistor MN3 operates similarly to a current source as described above, on-resistances exhibited by the N-channel MOS transistors MN1, MN2 are substantially smaller in relation to a resistance exhibited by the N-channel MOS transistor MN3, so that the output node N comes to be almost "0" level.

When the input signal $Q_1$ is "0", the P-channel MOS transistor MP3 comes to be in an ON state and the N-channel MOS transistor MN1 comes to be in an OFF state. As a result that the N-channel MOS transistor MN1 comes to be in the OFF state, a path from the output node N to the ground line is disconnected. When the output node N is "0", as a result that the P-channel MOS transistor MP3 comes to be in the ON state, a path connecting a power supply and the output node N is conducted. Thereby, the output node N transits to "1", and the output signal Z is determined to be "0" in response thereto. When the output node N is "1", the output signal Z has originally been determined to be "0", so that transition does not occur.

For example, as illustrated in FIG. 9, when the selection signal $S_1$ changes from "0" to "1" in a state where the input signal $Q_0$ is "1" and the input signal $Q_1$ is "0", the N-channel MOS transistor MN2 comes to be in the ON state and the P-channel MOS transistor MP2 comes to be in the OFF state. Then, the output node N comes to be "1" via the P-channel MOS transistor MP3 and the output signal Z comes to be "0".

Figure 7B:
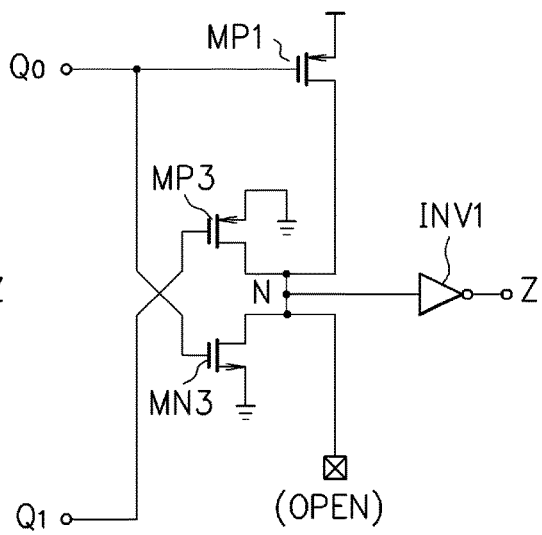
Figure 14A:
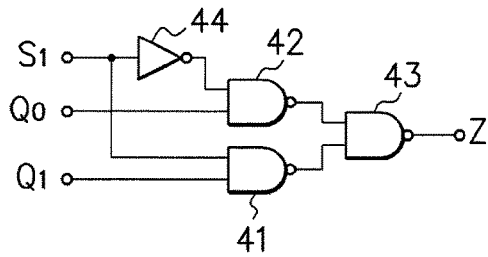
FIG. 14A to FIG. 14C are diagrams each illustrating a configuration example of a conventional two-input selector circuit.
Figure 14B:
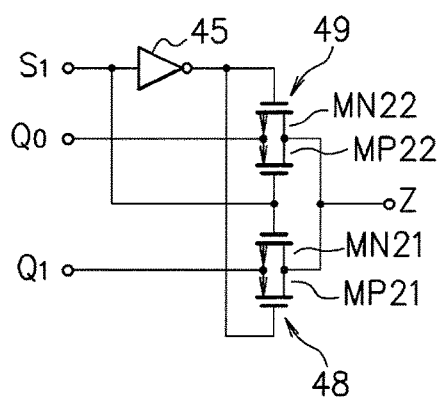
Figure 14C:
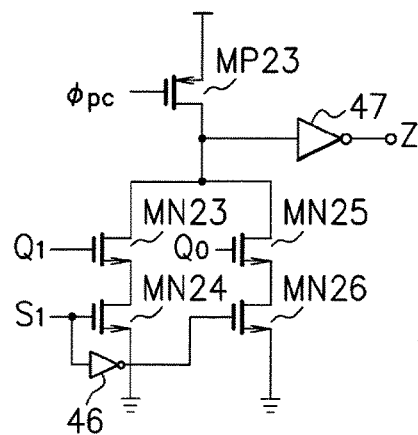

When the selection signal $S_1$ is "0", the P-channel MOS transistor MP2 comes to be in an ON state and the N-channel MOS transistor MN2 comes to be in an OFF state, and thus the signal path of the selector circuit illustrate in FIG. 6 becomes as illustrated in FIG. 7B.

When the input signal $Q_0$ is "0", the N-channel MOS transistor MN3 comes to be in an OFF state and the P-channel MOS transistor MP1 comes to be in an ON state. In a case where the P-channel MOS transistor MP1 is in the ON state, even if the P-channel MOS transistor MP3 is in the ON states, the P-channel MOS transistor MP3 operates in a saturation region (operates similarly to a current source), whereby the potential of the output node N comes to be a potential almost equal to a power supply voltage level. As a result that the potential of the output node N comes to be almost equal to the power supply voltage level, the output signal Z comes to be "0".

When the input signal $Q_0$ is "1", the N-channel MOS transistor MN3 comes to be in an ON state and the P-channel MOS transistor MP1 comes to be in an OFF state. As a result that the P-channel MOS transistor MP1 comes to be in the OFF state, the path from the output node N to the power supply line is disconnected. In a case where the output node N is "1", the N-channel MOS transistor MN3 comes to be in the ON state, whereby the path connecting the ground voltage and the output node N is conducted. Thereby, the output node N transits to "0" and the output signal Z is determined to be "1" in response thereto. In a case where the output node N is "0", the output signal Z has originally been determined to be "1", so that transition does not occur. As described above, also in the selector circuit illustrated in FIG. 6, a selector function can be performed without using an inversion signal of the selection signal $S_1$, so that a selector circuit which operates at a high speed can be realized.

The selector circuit in the present embodiment is not limited to the two-input selector circuit but is applicable also to a selector circuit which has three or more inputs. FIG. 10A is a diagram illustrating an example in which a four-input selector circuit is constituted with the selector circuit illustrated in FIG. 1 in the present embodiment. FIG. 10B is a diagram illustrating a truth table of the selector circuit illustrated in FIG. 10A. The four-input selector circuit illustrated in FIG. 10A includes three selector circuits SEL1A, SEL1B, SEL2 which are constituted similarly to the two-input selector circuit illustrated in FIG. 1.

The first selector circuit SEL1A includes P-channel MOS transistors MP1A to MP4A, N-channel MOS transistors MN1A to MN4A, and inverters INV1A, INV2A which are connected similarly to the selector circuit illustrated in FIG. 1. To the first selector circuit SEL1A, a first input signal $Q_0$ and a second input signal $Q_1$ are inputted as input signals and a zeroth bit of a selection signal S is inputted as a selection signal. The first selector circuit SEL1A outputs an inversion signal of the first input signal $Q_0$ when the zeroth bit of the selection signal S is "0", and outputs an inversion signal of the second input signal $Q_1$ when the zeroth bit of the selection signal S is "1".

The second selector circuit SEL1B includes P-channel MOS transistors MP1B to MP4B, N-channel MOS transistors MN1B to MN4B, and inverters INV1B, INV2B which are connected similarly to the selector circuit illustrated in FIG. 1. To the second selector circuit SEL1B, a third input signal $Q_2$ and a fourth input signal $Q_3$ are inputted as input signals and the zeroth bit of the selection signal S is inputted as a selection signal. The second selector circuit SEL1B outputs an inversion signal of the third input signal $Q_2$ when the zeroth bit of the selection signal S is "0", and outputs an inversion signal of the fourth input signal $Q_3$ when the zeroth bit of the selection signal S is "1".

The third selector circuit SEL2 includes P-channel MOS transistors MP1C to MP4C, N-channel MOS transistors MN1C to MN4C, and inverters INV1C, INV2C which are connected similarly to the selector circuit illustrated in FIG. 1. To the third selector circuit SEL2, an output of the first selector circuit SEL1A and an output of the second selector circuit SEL1B are inputted as input signals and a first bit of the selection signal S is inputted as a selection signal. The third selector circuit SEL2 outputs an inversion signal of the output of the first selector circuit SEL1A when the first bit of the selection signal S is "0", and outputs an inversion signal of the output of the second selector circuit SEL1B when the first bit of the selection signal S is "1".

By combining the three selector circuits illustrated in FIG. 1 as described above, it is possible to realize the four-input selector circuit which selects four input signals $Q_0$ to $Q_3$ for the two bits selection signal S<1:0>. Since the output signal Z is outputted through two stages of the selector circuits illustrated in FIG. 1, the output signal Z of positive logic can be outputted at a high speed by using all outputs of nodes NA, NB, NC being inversion outputs of the selector circuit.

FIG. 11 is a diagram illustrating a configuration example of a decision feedback equalizer to which the selector circuit in the present embodiment is applied. The decision feedback equalizer illustrated in FIG. 11 is used for a receiver or the like of a serializer/de-serializer (SerDes), for example.

A comparison circuit 12A performs binary decision to an input serial signal IN which is inputted via a buffer 11 by using a first reference voltage $V_0$, and outputs a decision result. A comparison circuit 12B performs binary decision to the input serial signal IN which is inputted via the buffer 11 by using a second reference voltage $V_1$, and outputs a decision result. The first reference voltage $V_0$ is a reference voltage corresponding to a case where previous data is "0". The second reference voltage $V_1$ is a reference voltage corresponding to a case where the previous data is "1". The second reference voltage $V_1$ is higher than the first reference voltage $V_0$.

A flip-flop 13A latches the decision result outputted from the comparison circuit 12A in synchronization with a clock signal CK which performs sampling of a serial signal, and outputs the latched decision result to a selector circuit 14 as a first input signal $Q_0$. A flip-flop 13B latches the decision result outputted from the comparison circuit 12B in synchronization with the clock signal CK, and outputs the latched decision result to the selector circuit 14 as a second input signal $Q_1$.

The selector circuit 14 is the two-input selector circuit in the present embodiment described above. The selector circuit 14 selectively outputs the first input signal $Q_0$ or the second input signal $Q_1$ in correspondence with a selection signal $S_1$. In the present embodiment, the selector circuit 14 selects the first input signal $Q_0$ and outputs as an output signal Z when the selection signal $S_1$ is "0", and selects the second input signal $Q_1$ and outputs as the output signal Z when the selection signal $S_1$ is "1". A flip-flop 15 latches the output signal Z of the selector circuit 14 in synchronization with the clock signal CK, and outputs the latched signal as an output signal OUT and outputs the latched signal to the selector circuit 14 as the selection signal $S_1$ related to the next data.

In the decision feedback equalizer, for the input serial signal IN whose high-frequency component is weakened by passing through a transmission path or the like, codes are decided to different reference voltages which facilitate decision of codes of input signals in the next sampling respectively in correspondence with decision results of the codes in previous sampling in order to supplement the lost high-frequency component. Here, decision results to the reference voltages $V_0$, $V_1$ corresponding to "0" and "1" being decision results in the previous sampling are prepared in advance, and the selector circuit 14 selects the proper input based on the codes (data) in the previous sampling. In the decision feedback equalizer, the selector circuit is required of a high-speed operation in order to quickly reflect a previous sampling result on selection of the next sampling result, and the high-speed operation is possible according to the selector circuit in the present embodiment, which realizes the selector function without using the inversion signal of the selection signal.

FIG. 12 is a diagram illustrating a configuration example of a semiconductor integrated circuit which includes the decision feedback equalizer illustrated in FIG. 11. The semiconductor integrated circuit 21 in the present embodiment includes a reception circuit 22 which has a function of a de-serializer that converts an input serial signal into a parallel signal and an internal circuit 29 such as a logic circuit which performs a processing operation after receiving the parallel signal (data) from the reception circuit 22.

The reception circuit 22 includes a front end circuit 23, a clock data recovery circuit 27, and a clock generator 28. The front end circuit 23 includes a differential buffer 24, a decision feedback equalizer 25, and a demultiplexer 26. The differential buffer 24 receives differential input serial signals RXIN, RXINX transmitted via a transmission path or the like. The decision feedback equalizer 25 is the decision feedback equalizer illustrated in FIG. 11, for example, and decides a code (data) of the input serial signal. The demultiplexer 26 performs serial-parallel conversion to an output of the decision feedback equalizer 25 and outputs as a parallel signal RXOUT and outputs a reception data clock RXCLKO.

The clock data recovery circuit 27 properly controls a phase of a clock signal which the clock generator 28 outputs based on a received signal. The decision feedback equalizer 25 performs sampling of the input serial signal at a proper timing by using the clock signal which the clock generator 28 outputs. The parallel signal RXOUT outputted from the reception circuit 22 is taken into the internal circuit 29 by a flip-flop 30 which operates by the reception data clock RXCLKO, and is subjected to a processing or the like.

The aforementioned embodiments merely illustrate concrete examples of implementing the present invention and are not intended to limit the interpretation of the technical scope of the present invention. In other words, the present invention can be implemented in various manners without departing from the technical spirits or main features thereof.

A disclosed selector circuit selectively outputs a first input signal or a second input signal in correspondence with a selection signal, and a high-speed operation can be realized without using an inversion signal of the selection signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A selector circuit comprising:
   a first P-channel transistor and a second P-channel transistor that are provided in series between a power supply line and an output node, a first input signal being inputted to a gate of the first P-channel transistor and a selection signal being inputted to a gate of the second P-channel transistor;
   a first N-channel transistor and a second N-channel transistor that are provided in series between a ground line and the output node, a second input signal being inputted to a gate of the first N-channel transistor and the selection signal being inputted to a gate of the second N-channel transistor;
   a third P-channel transistor that is provided between the gate of the second P-channel transistor and the output node, the second input signal being inputted to a gate of the third P-channel transistor; and
   a third N-channel transistor that is provided between the gate of the second N-channel transistor and the output node, the first input signal being inputted to a gate of the third N-channel transistor.

2. The selector circuit according to claim 1,
   wherein when the selection signal is at a first logic level, the second P-channel transistor comes to be in an OFF state and the second N-channel transistor comes to be in an ON state, and either one of the first N-channel transistor and the third P-channel transistor comes to be in an ON state in correspondence with the second input signal and outputs a signal corresponding to a value of the second input signal, and
   wherein when the selection signal is at a second logic level different from the first logic level, the second P-channel transistor comes to be in an ON state and the second N-channel transistor comes to be in an OFF state, and either one of the first P-channel transistor and the third N-channel transistor comes to be in an ON state in correspondence with the first input signal and outputs a signal corresponding to a value of the first input signal.

3. The selector circuit according to claim 1, comprising an inverter configured to logically invert the signal of the output node and output as an output signal.

4. The selector circuit according to claim 1, comprising:
   a fourth P-channel transistor that is provided in series in relation to the third P-channel transistor between the gate of the second P-channel transistor and the output node, a control signal with the same value as a value of the output node being inputted to a gate of the fourth P-channel transistor; and
   a fourth N-channel transistor that is provided in series in relation to the third N-channel transistor between the gate of the second N-channel transistor and the output node, the control signal being inputted to a gate of the fourth N-channel transistor.

5. The selector circuit according to claim 4, comprising:
   a first inverter configured to logically invert a signal of the output node and output as an output signal; and
   a second inverter configured to generate the control signal by logically inverting the output signal.

6. The selector circuit according to claim 4,
   wherein when the selection signal is at a first logic level, the second P-channel transistor comes to be in an OFF state and the second N-channel transistor comes to be in an ON state, and either one of the first N-channel transistor and the third P-channel transistor comes to be in an ON state in correspondence with the second input signal and outputs a signal corresponding to a value of the second input signal, and
   wherein when the selection signal is at a second logic level different from the first logic level, the second P-channel transistor comes to be in an ON state and the second N-channel transistor comes to be in an OFF state, and either one of the first P-channel transistor and the third N-channel transistor comes to be in an ON state in correspondence with the first input signal and outputs a signal corresponding to a value of the first input signal.

7. An equalizer circuit comprising:
   a first comparison circuit configured to perform binary decision to an input serial signal by using a first reference voltage;
   a second comparison circuit configured to perform binary decision to the input serial signal by using a second reference voltage higher than the first reference voltage;
   a selector circuit configured to select and output an output of the first comparison circuit or an output of the second comparison circuit in correspondence with a selection signal; and
   a flip-flop configured to latch an output of the selector circuit, to output the latched output as an output signal and to output the latched output to the selector circuit as the selection signal,
   wherein the selector circuit includes:
   a first P-channel transistor and a second P-channel transistor that are provided in series between a power supply line and an output node, the output of the first comparison circuit being inputted to a gate of the first P-channel transistor and the selection signal being inputted to a gate of the second P-channel transistor;
   a first N-channel transistor and a second N-channel transistor that are provided in series between a ground line and the output node, the output of the second comparison circuit being inputted to a gate of the first N-channel transistor and the selection signal being inputted to a gate of the second N-channel transistor;
   a third P-channel transistor that is provided between the gate of the second P-channel transistor and the output node, the output of the second comparison circuit being inputted to a gate of the third P-channel transistor; and a third N-channel transistor that is provided between the gate of the second N-channel transistor and the output node, the output of the first comparison circuit being inputted to a gate of the third N-channel transistor.

8. The equalizer circuit according to claim 7,
wherein the selector circuit includes:
a fourth P-channel transistor that is provided in series in relation to the third P-channel transistor between the gate of the second P-channel transistor and the output node, a control signal with the same value as a value of the output node being inputted to a gate of the fourth P-channel transistor; and
a fourth N-channel transistor that is provided in series in relation to the third N-channel transistor between the gate of the second N-channel transistor and the output node, the control signal being inputted to a gate of the fourth N-channel transistor.

9. The equalizer circuit according to claim 8,
a first inverter configured to logically invert a signal of the output node and output as an output signal; and
a second inverter configured to generate the control signal by logically inverting the output signal.

10. The equalizer circuit according to claim 7,
wherein when the selection signal is at a first logic level, in the selector circuit, the second P-channel transistor comes to be in an OFF state and the second N-channel transistor comes to be in an ON state, and either one of the first N-channel transistor and the third P-channel transistor comes to be in an ON state in correspondence with the output of the second comparison circuit and outputs a signal corresponding to a value of the output of the second comparison circuit, and
wherein when the selection signal is at a second logic level different from the first logic level, in the selector circuit, the second P-channel transistor comes to be in an ON state and the second N-channel transistor comes to be in an OFF state, and either one of the first P-channel transistor and the third N-channel transistor comes to be in an ON state in correspondence with the output of the first comparison circuit and outputs a signal corresponding to a value of the output of the first comparison circuit.

11. The equalizer circuit according to claim 7,
wherein the selector circuit includes an inverter configured to logically invert the signal of the output node and output as an output signal.

12. A semiconductor integrated circuit, comprising:
an equalizer circuit configured to perform sampling of an input serial signal by using a clock signal and to decide data;
a demultiplexer configured to serial-parallel convert an output signal of the equalizer circuit and to output a parallel signal; and
a clock data recovery circuit configured to control a phase of the clock signal based on a received signal,
wherein the equalizer circuit includes:
a first comparison circuit configured to perform binary decision to the input serial signal by using a first reference voltage;
a second comparison circuit configured to perform binary decision to the input serial signal by using a second reference voltage higher than the first reference voltage;

a selector circuit configured to select and output an output of the first comparison circuit or an output of the second comparison circuit in correspondence with a selection signal; and
a flip-flop configured to latch an output of the selector circuit by using the clock signal, to output the latched output as the output signal and to output the latched output to the selector circuit as the selection signal, and
wherein the selector circuit includes:
a first P-channel transistor and a second P-channel transistor that are provided in series between a power supply line and an output node, the output of the first comparison circuit being inputted to a gate of the first P-channel transistor and the selection signal being inputted to a gate of the second P-channel transistor;
a first N-channel transistor and a second N-channel transistor that are provided in series between a ground line and the output node, the output of the second comparison circuit being inputted to a gate of the first N-channel transistor and the selection signal being inputted to a gate of the second N-channel transistor;
a third P-channel transistor that is provided between the gate of the second P-channel transistor and the output node, the output of the second comparison circuit being inputted to a gate of the third P-channel transistor; and
a third N-channel transistor that is provided between the gate of the second N-channel transistor and the output node, the output of the first comparison circuit being inputted to a gate of the third N-channel transistor.

13. The semiconductor integrated circuit according to claim 12,
wherein the selector circuit includes:
a fourth P-channel transistor that is provided in series in relation to the third P-channel transistor between the gate of the second P-channel transistor and the output node, a control signal with the same value as a value of the output node being inputted to a gate of the fourth P-channel transistor; and
a fourth N-channel transistor that is provided in series in relation to the third N-channel transistor between the gate of the second N-channel transistor and the output node, the control signal being inputted to a gate of the fourth N-channel transistor.

14. The semiconductor integrated circuit according to claim 13,
a first inverter configured to logically invert a signal of the output node and output as an output signal; and
a second inverter configured to generate the control signal by logically inverting the output signal.

15. The semiconductor integrated circuit according to claim 12,
wherein when the selection signal is at a first logic level, in the selector circuit, the second P-channel transistor comes to be in an OFF state and the second N-channel transistor comes to be in an ON state, and either one of the first N-channel transistor and the third P-channel transistor comes to be in an ON state in correspondence with the output of the second comparison circuit and outputs a signal corresponding to a value of the output of the second comparison circuit, and
wherein when the selection signal is at a second logic level different from the first logic level, in the selector circuit, the second P-channel transistor comes to be in an ON state and the second N-channel transistor comes to be in an OFF state, and either one of the first P-channel transistor and the third N-channel transistor comes to be in an ON state in correspondence with the output of the first comparison circuit and outputs a signal corresponding to a value of the output of the first comparison circuit.

16. The semiconductor integrated circuit according to claim 12,
wherein the selector circuit includes an inverter configured to logically invert the signal of the output node and output as an output signal.

17. The semiconductor integrated circuit according to claim 12, comprising
an internal circuit configured to perform a processing operation after receiving the parallel signal from the demultiplexer.

18. The semiconductor integrated circuit according to claim 17,
wherein the selector circuit includes:
a fourth P-channel transistor that is provided in series in relation to the third P-channel transistor between the gate of the second P-channel transistor and the output node, a control signal with the same value as a value of the output node being inputted to a gate of the fourth P-channel transistor; and
a fourth N-channel transistor that is provided in series in relation to the third N-channel transistor between the gate of the second N-channel transistor and the output node, the control signal being inputted to a gate of the fourth N-channel transistor.

19. The semiconductor integrated circuit according to claim 17,
wherein when the selection signal is at a first logic level, in the selector circuit, the second P-channel transistor comes to be in an OFF state and the second N-channel transistor comes to be in an ON state, and either one of the first N-channel transistor and the third P-channel transistor comes to be in an ON state in correspondence with the output of the second comparison circuit and outputs a signal corresponding to a value of the output of the second comparison circuit, and
wherein when the selection signal is at a second logic level different from the first logic level, in the selector circuit, the second P-channel transistor comes to be in an ON state and the second N-channel transistor comes to be in an OFF state, and either one of the first P-channel transistor and the third N-channel transistor comes to be in an ON state in correspondence with the output of the first comparison circuit and outputs a signal corresponding to a value of the output of the first comparison circuit.

* * * * *